United States Patent
Okamoto et al.

(10) Patent No.: US 9,324,497 B2
(45) Date of Patent: Apr. 26, 2016

(54) DIELECTRIC THIN FILM, DIELECTRIC THIN FILM ELEMENT AND THIN FILM CAPACITOR

(71) Applicants: MURATA MANUFACTURING CO., LTD., Nagaokakyo-Shi (JP); National Institute for Materials Science, Ibaraki (JP)

(72) Inventors: Takafumi Okamoto, Nagaokakyo (JP); Minoru Osada, Tsukuba (JP); Takayoshi Sasaki, Tsukuba (JP)

(73) Assignees: MURATA MANUFACTURING CO., LTD., Nagaokakyo-Shi, Kyoto-Fu (JP); NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 168 days.

(21) Appl. No.: 14/051,147

(22) Filed: Oct. 10, 2013

(65) Prior Publication Data

US 2014/0036410 A1 Feb. 6, 2014

Related U.S. Application Data

(63) Continuation of application No. PCT/JP2012/060691, filed on Apr. 20, 2012.

(30) Foreign Application Priority Data

Jul. 5, 2011 (JP) ................................ 2011-149486

(51) Int. Cl.
*H01G 4/10* (2006.01)
*H01G 4/33* (2006.01)
(Continued)

(52) U.S. Cl.
CPC ................. *H01G 4/10* (2013.01); *H01G 4/018* (2013.01); *H01G 4/18* (2013.01); *H01G 4/206* (2013.01);
(Continued)

(58) Field of Classification Search
None
See application file for complete search history.

(56) References Cited

U.S. PATENT DOCUMENTS

2006/0120014 A1* 6/2006 Nakamura et al. ............ 361/305
2011/0000698 A1* 1/2011 Osada et al. ............... 174/137 B

FOREIGN PATENT DOCUMENTS

JP     08-203792     9/1996
JP     9-115767     2/1997
(Continued)

OTHER PUBLICATIONS

PCT/JP2012/060691, International Search Report date of mailing Jul. 10, 2012.
(Continued)

*Primary Examiner* — Dion R Ferguson
(74) *Attorney, Agent, or Firm* — Arent Fox LLP

(57) ABSTRACT

A thin film capacitor includes a substrate and a dielectric thin film element formed on the substrate. The substrate can include an Si plate, an $SiO_2$ film on the Si plate, and a Ti film formed on the $SiO_2$ film. The dielectric thin film element includes a lower electrode, a dielectric thin film on the lower electrode, and an upper electrode formed on the dielectric thin film. The dielectric thin film is a thin film formed of a nanosheet, and a void portion of the dielectric thin film is filled with a p-type conductive organic polymer. $Ti_{0.87}O_2$, $Ca_2Nb_3O_{10}$ or the like, is used as a dielectric material to form a major component of the nanosheet. As the p-type conductive organic polymer, polypyrrole, polyaniline, polyethylene dioxythiophene or the like, is suitable.

4 Claims, 3 Drawing Sheets

(51) Int. Cl.
*H01G 4/18* (2006.01)
*H01L 51/05* (2006.01)
*H01L 49/02* (2006.01)
*H01G 4/018* (2006.01)
*H01L 29/94* (2006.01)
*H01G 4/20* (2006.01)
*H01L 51/00* (2006.01)

(52) U.S. Cl.
CPC ............... *H01G 4/33* (2013.01); *H01L 28/40* (2013.01); *H01L 29/94* (2013.01); *H01L 51/0579* (2013.01); *H01L 51/0037* (2013.01)

(56) References Cited

FOREIGN PATENT DOCUMENTS

| | | |
|---|---|---|
| JP | 2001-006973 A | 1/2001 |
| JP | 2002-185148 A | 6/2002 |
| JP | 2007-115986 A | 5/2007 |
| JP | 2008160040 | 7/2008 |
| JP | 2010-126735 A | 6/2010 |
| JP | 2010-215470 A | 9/2010 |
| WO | WO-2007/094244 A1 | 8/2007 |
| WO | WO-2008/078652 A1 | 7/2008 |

OTHER PUBLICATIONS

PCT/JP2012/060691, International filed Apr. 20, 2012, PCT Written Opinion of International Searching Authority, date of mailing Oct. 7, 2012.

* cited by examiner

DIELECTRIC THIN FILM, DIELECTRIC THIN FILM ELEMENT AND THIN FILM CAPACITOR

This is a continuation of application Serial No. PCT/JP2012/060691, filed Apr. 20, 2012, the entire contents of which is incorporated herein by reference.

TECHNICAL FIELD

The present invention relates to a dielectric thin film, a dielectric thin film element and a thin film capacitor.

BACKGROUND ART

Hitherto, there are known a dielectric thin film formed of a nanosheet, and a dielectric thin film element having electrodes disposed on both sides of the nanosheet dielectric thin film. For example, PTD 1 discloses a dielectric thin film formed of a titanium dioxide nanosheet, and a dielectric thin film element having electrodes disposed on both sides of the titanium dioxide nanosheet dielectric thin film. Further, PTD 2 discloses a dielectric thin film formed of a nanosheet having a perovskite structure, and a dielectric thin film element having electrodes disposed on both sides of the nanosheet dielectric thin film. Furthermore, PTD 3 discloses a nanosheet dielectric thin film formed according to a manufacturing method which includes the step of forming an organic molecular film of silane compounds on a surface of a substrate on which a dielectric nanosheet is to be formed and applying a surface potential to the organic molecular film, and the step of stacking titanium dioxide nanosheets on the substrate.

CITATION LIST

Patent Document

PTD 1: WO 2007/094244
PTD 2: WO 2008/078652
PTD 3: Japanese Patent Laying-Open No. 2010-215470

SUMMARY OF INVENTION

Technical Problem

Depending on substrate types or pre-treatment methods, the size or shape of the nanosheet in the surface direction thereof may vary, resulting in forming a void or a defect on the nanosheet dielectric thin films disclosed in PTD 1 and PTD 2, which makes them impossible to provide suitable insulation for practical use. Although the nanosheet of the nanosheet dielectric thin film disclosed in PTD 3 has a high density, the size or shape of the nanosheet in the surface direction thereof may vary, resulting in forming a void or a defect. As a result, the nanosheet dielectric thin film disclosed in PTD 3 has a great leakage current, which makes it impossible to maintain suitable insulation for practical use.

Accordingly, an object of the present invention is to provide a dielectric thin film, a dielectric thin film element and a thin film capacitor which are capable of reducing leakage current.

Solution to Problem

The present invention provides a dielectric thin film formed of a nanosheet. A void portion of the dielectric thin film is filled with a p-type conductive organic polymer. Herein, the "nanosheet" referred to is a film which is available through a layer separation reaction on a compound having a layered crystal structure and has a thickness of several nanometers.

In the present invention, a void portion of the dielectric thin film is filled with a p-type conductive organic polymer, and thereby, the p-type conductive organic polymer is electrically insulated. Combining the electrically insulated p-type conductive organic polymer with the nanosheet enables the leakage current in the dielectric thin film to be reduced. In the dielectric thin film of the present invention, the p-type conductive organic polymer is any one of polypyrrole, polyaniline and polyethylene dioxythiophene. Accordingly, the leakage current in the dielectric thin film can be reduced with certainty.

The present invention provides a dielectric thin film element including the dielectric thin film and at least a pair of electrodes configured to sandwich the dielectric thin film. Alternatively, the present invention provides a thin film capacitor including the dielectric thin film element and a substrate for disposing the dielectric thin film element. Accordingly, a dielectric thin film element or a thin film capacitor having excellent leakage current characteristics can be obtained.

Advantageous Effects of Invention

According to the present invention, the combination of the electrically insulated p-type conductive organic polymer with the nanosheet enables the dielectric thin film to reduce the leakage current even at a thickness on the order of nanometers since the void portion of the dielectric thin film is filled by the p-type conductive organic polymer. This gives birth to a dielectric thin film element and a thin film capacitor having excellent leakage current characteristics.

The foregoing and other objects, features, aspects and advantages of the present invention will become more apparent from the following description of embodiments for implementing the present invention with reference to the drawings.

REFERENCE SIGNS LIST

1: thin film capacitor; 2: Si plate; 4: $SiO_2$ film; 6: Ti film; 8: lower electrode; 10: substrate; 12: dielectric thin film; 14: upper electrode; 16: dielectric thin film element

DESCRIPTION OF EMBODIMENTS

Thin Film Capacitor

Figure 1:
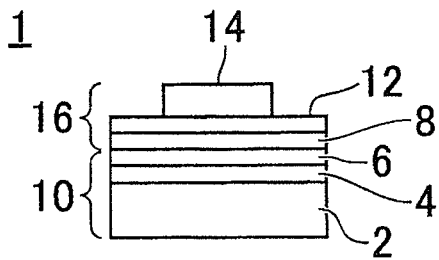
FIG. 1 is a schematic view illustrating a configuration of a thin film capacitor according to an embodiment of the present invention.

FIG. 1 is a schematic view illustrating a configuration of a thin film capacitor according to an embodiment of the present invention. The thin film capacitor 1 includes a substrate 10, and a dielectric thin film element 16 formed on substrate 10. Substrate 10 is formed to include an Si plate 2, an $SiO_2$ film 4 formed on Si plate 2, and a Ti film 6 formed on $SiO_2$ film 4.

Dielectric thin film element 16 is configured to include a lower electrode 8, a dielectric thin film 12 formed on lower electrode 8, and an upper electrode 14 formed on dielectric thin film 12. Lower electrode 8 and upper electrode 14 are made of Pt, Au, Cu, Ag, Ag—Pd or the like.

Dielectric thin film 12 is a thin film formed of a nanosheet, and it has a void portion (not shown) filled with a p-type conductive organic polymer. $Ti_{0.87}O_2$, $Ca_2Nb_3O_{10}$ or the like is used as a dielectric material for the nanosheet. As a p-type conductive organic polymer, a polypyrrole, polyaniline, polyethylene dioxythiophene (PEDOT) or the like is suitable. The thickness of dielectric thin film 12 is about 10 nm in the embodiment shown in FIG. 1. Since the p-type conductive organic polymer fills a void portion in dielectric thin film 12, the p-type conductive organic polymer is electrically insulated. Combining the electrically insulated p-type conductive organic polymer with the nanosheet enables dielectric thin film 12 to reduce leakage current even at a thickness on the order of nanometers. As a result, the thin film capacitor 1 has excellent leakage current characteristics.

Method for Manufacturing Thin Film Capacitor

Figure 2:
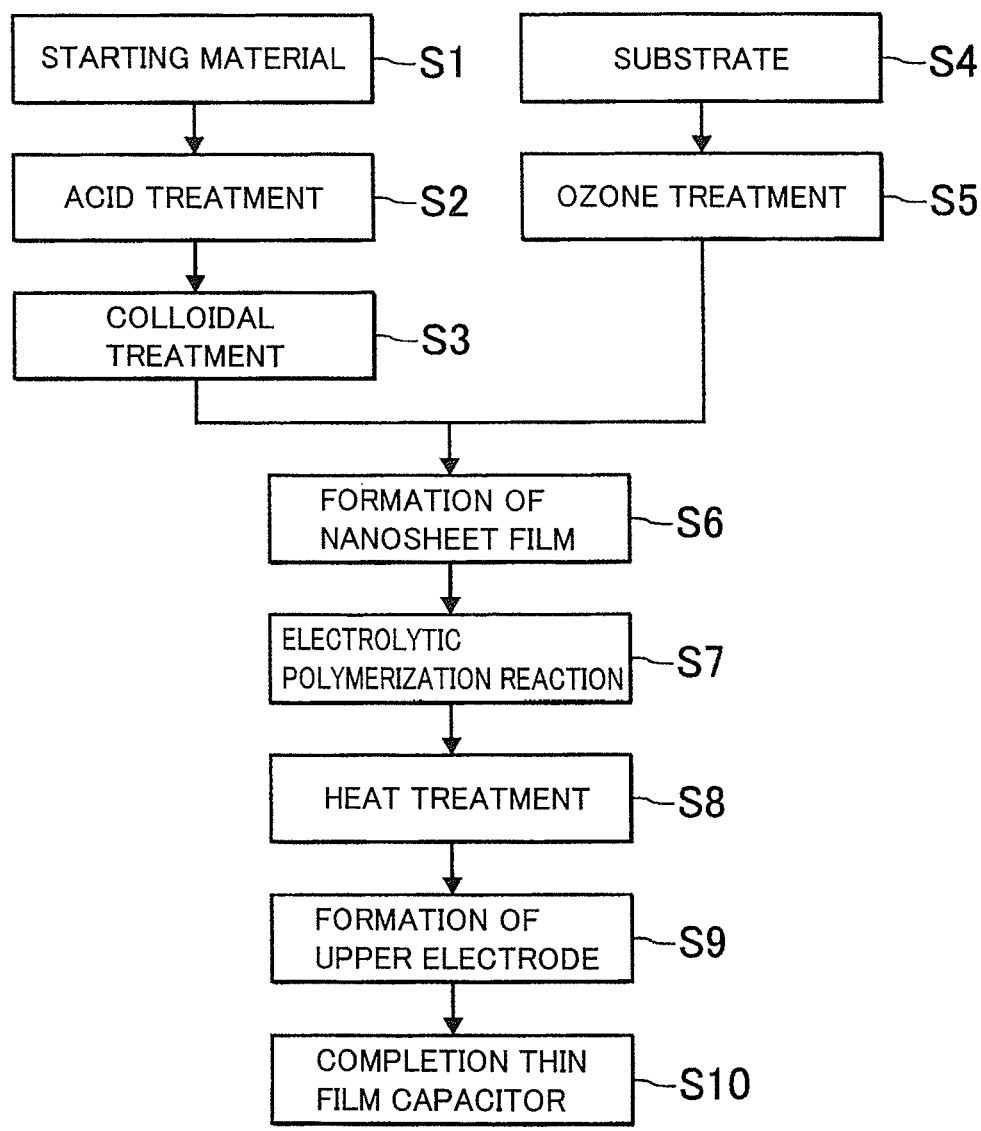
FIG. 2 is a flow chart illustrating an example of a method for manufacturing the thin film capacitor illustrated in FIG. 1.

Hereinafter, an example of a method for manufacturing thin film capacitor 1 will be explained. FIG. 2 is a flow chart illustrating an example of the method for manufacturing the thin film capacitor illustrated in FIG. 1.

Firstly, $K_{0.88}Li_{0.267}Ti_{1.733}O_4$ is prepared as a layered inorganic oxide serving as a starting material for preparing a colloid for the dielectric nanosheet at step S1. Next, at step S2, the prepared layered inorganic oxide $K_{0.88}Li_{0.267}Ti_{1.733}O_4$ is subjected to an acid treatment with nitric acid. Then, the layered inorganic oxide $K_{0.88}Li_{0.267}Ti_{1.733}O_4$ subjected to the acid treatment is stirred in a tetrabutylammonium hydroxide aqueous solution at step S3 to undergo a colloidal treatment. Thereby, a colloid for the dielectric nanosheet having a composition of $Ti_{0.87}O_2$ is obtained.

Similarly, another type of colloid for the dielectric nanosheet is prepared. Specifically, $KCa_2Nb_3O_{10}$ is prepared as a layered inorganic oxide serving as a starting material at step S1. Next, at step S2, the prepared layered inorganic oxide $KCa_2Nb_3O_{10}$ is subjected to an acid treatment with nitric acid. Then, the layered inorganic oxide $KCa_2Nb_3O_{10}$ subjected to the acid treatment is stirred in tetrabutylammonium hydroxide aqueous solution at step S3, to undergo a colloidal treatment. Thereby, a colloid for the dielectric nanosheet having a composition of $Ca_2Nb_3O_{10}$ is obtained.

It should be noted that the preparation of the colloid is not limited to the above method, as long as alkali metal ions (K ions and Li ions in the case of the present embodiment) in the layers of the starting material can undergo proton substitution in an organic amine basic solution or an organic ammonium based basic solution so as to give birth to a nanosheet.

Figure 3:
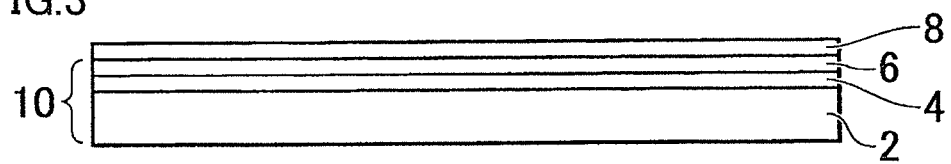
FIG. 3 is an explanatory view for explaining the method for manufacturing the thin film capacitor.

Meanwhile, at step S4 of FIG. 2, a substrate 10 (shown in FIG. 3) having a size of 1 cm×1.5 cm is prepared with a Pt film 8 formed on an upper surface thereof, and substrate 10 will be used as a substrate on which dielectric thin film 12 is to be formed. Specifically, the substrate (hereinafter referred to as Pt substrate) having a structure of Si plate 2/$SiO_2$ film 4/Ti film 6/Pt film 8 is prepared. The Root-Mean-Square surface roughness (RMS) of the superficial surface of Pt film 8 is about 10 nm in a range of 50 µm×50 µm. Pt film 8 should be used as a lower electrode of dielectric thin film element 16. At step S5, the Pt substrate is ultraviolet irradiated in an oxygen atmosphere to undergo an ozone treatment.

Figure 4:
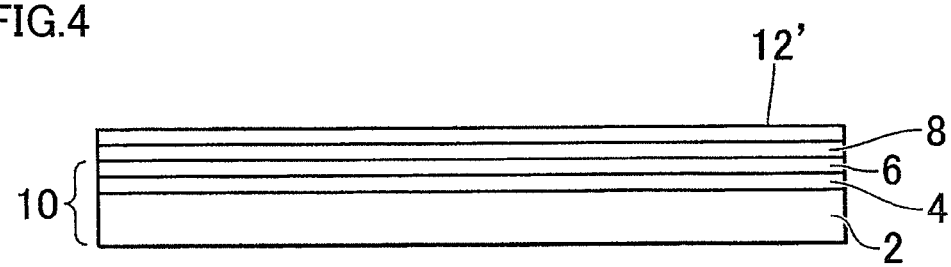
FIG. 4 is an explanatory view for explaining the method for manufacturing the thin film capacitor subsequent to FIG. 3.

Next, at step S6, through the use of the colloid and the Pt substrate, a nanosheet film 12' is formed on the Pt substrate (shown in FIG. 4). Specifically, a dense film transcription according to the known Langmuir-Blodgett method is repeatedly conducted on the Pt substrate to form $Ti_{0.87}O_2$ colloid into $Ti_{0.87}O_2$ nanosheet film 12' on the Pt substrate. Similarly, the dense film transcription according to the known Langmuir-Blodgett method is repeatedly conducted on the Pt substrate to form $Ca_2Nb_3O_{10}$ colloid into $Ca_2Nb_3O_{10}$ nanosheet film 12' on the Pt substrate. The number of times the dense film transcription is repeated to form nanosheet film 12' into the thickness of about 10 nm is 10 in the case of $Ti_{0.87}O_2$ colloid; and in the case of $Ca_2Nb_3O_{10}$ colloid, the number of times is 7. The obtained nanosheet film 12' is subjected to ultraviolet irradiation (irradiation intensity: 4 mW/cm$^2$, irradiation time: 24 hours) by using an xenon light source. It should be noted that nanosheet film 12' may be prepared according to another preparation method without affecting the effects of the present invention.

Figure 5:
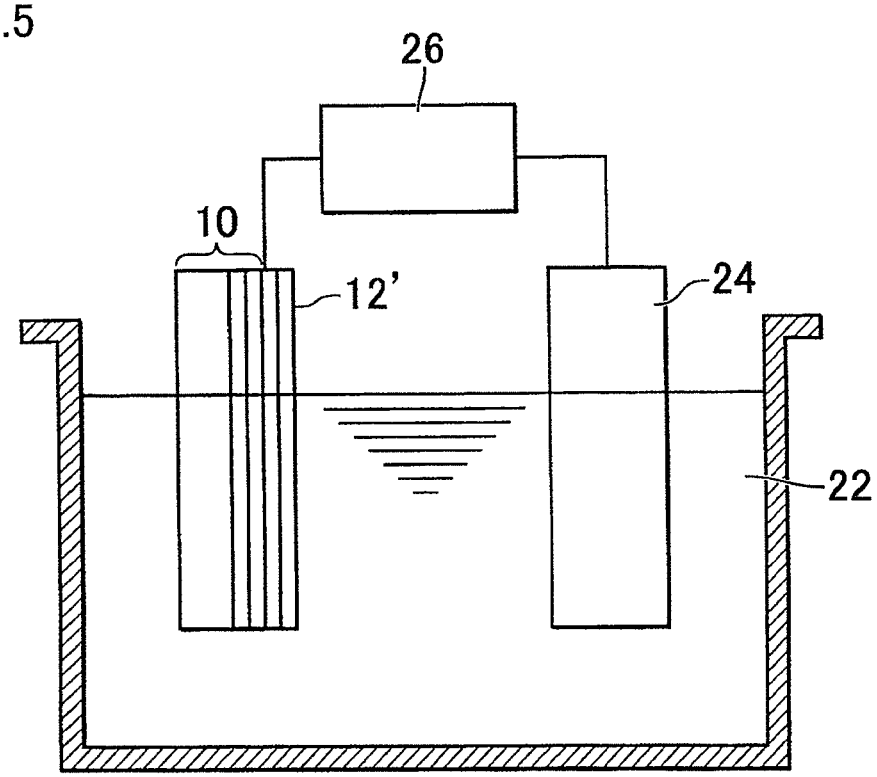
FIG. 5 is an explanatory view for explaining the method for manufacturing the thin film capacitor subsequent to FIG. 4.

Next, at step S7, and as shown in FIG. 5, the Pt substrate is immersed in an electrolytic polymerization solution 22 to conduct an electrolytic polymerization reaction on nanosheet film 12'. Specifically, a region of 1 cm×1 cm of nanosheet film 12' is immersed in electrolytic polymerization solution 22, and is galvanized for 50 seconds by an electrical current of 10 µA from a galvanostat (constant current device) 26, with the Pt substrate being used as an anode and an SUS plate 24 being used as a cathode. Thereby, a p-type conductive organic polymer fills a void portion of the nanosheet film 12' to form dielectric thin film 12. In a case where polyaniline is used as the p-type conductive organic polymer, the electrolytic polymerization solution 22 is an aqueous solution containing aniline (at a concentration of 0.3 mol/L) and HCl (at a concentration of 0.1 mol/L). When polypyrrole is used as the p-type conductive organic polymer, the electrolytic polymerization solution 22 is an aqueous solution containing pyrrole (at a concentration of 0.3 mol/L) and sodium p-toluenesulfonate (at a concentration of 0.1 mol/L). In a case where polyethylene dioxythiophene (PEDOT) is used as the p-type conductive organic polymer, the electrolytic polymerization solution 22 is a benzonitrile solution containing ethylenedioxythiophene (at a concentration of 0.4 mol/L) and $LiBF_4$ (at a concentration of 0.2 mol/L). After the reaction is completed, the Pt substrate is thoroughly washed with pure water.

Figure 6:
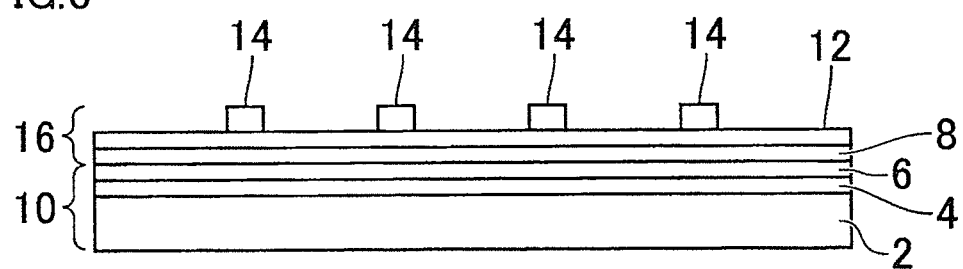
FIG. 6 is an explanatory view for explaining the method for manufacturing the thin film capacitor subsequent to FIG. 5.

Next, at step S8, the Pt substrate is subjected to a heat treatment in an air atmosphere at a heating condition of 270° C. for 180 minutes. Thereafter, at step S9, a mesh-shaped metal mask is covered on dielectric thin film 12, and Au is vapor-deposited on dielectric thin film 12 at a plurality of locations to form upper electrode 14, as shown in FIG. 6. After the formation of upper electrode 14, the metal mask is removed. Upper electrode 14 is 0.2 mm$^2$ in size and about 50 nm in thickness. Thereafter, at step S10, the Pt substrate is cut into a predetermined size to form thin film capacitor 1 as shown in FIG. 1.

Evaluation of Thin Film Capacitor

The insulation resistance of thin film capacitor 1 obtained in this manner was measured by using a semiconductor parameter analyzer manufactured by Keithley Instruments. The evaluation results are shown in Table 1. If a sample, had an insulation resistance of $10^7 \Omega$ or less when applied with a DC voltage of 0.1 V, it was determined as a short circuit (NG).

TABLE 1

| Sample No. | Dielectric Thin Film | Conductive Organic Polymer | Short Circuit Number (NG number/number of sample specimens) |
|---|---|---|---|
| *1 | $Ti_{0.87}O_2$ | — | 100/100 |
| *2 | $Ca_2Nb_3O_{10}$ | — | 100/100 |
| 3 | $Ti_{0.87}O_2$ | polypyrrole | 1/100 |
| 4 | $Ca_2Nb_3O_{10}$ | polypyrrole | 4/100 |
| 5 | $Ca_2Nb_3O_{10}$ | polyaniline | 0/100 |
| 6 | $Ca_2Nb_3O_{10}$ | PEDOT | 3/100 |
| *7 | $Ti_{0.87}O_2$ | polypyridine | 100/100 |
| *8 | $Ca_2Nb_3O_{10}$ | polypyridine | 100/100 |
| *9 | $Ca_2Nb_3O_{10}$ | PPV | 100/100 |

*denoting samples beyond the scope of the present invention

In Table 1, sample No. 3 represents a thin film capacitor 1 with polypyrrole as the p-type conductive organic polymer in the void portion of dielectric thin film 12 formed of $Ti_{0.87}O_2$. Sample No. 4 represents thin film capacitor 1 with polypyrrole as the p-type conductive organic polymer in the void portion of dielectric thin film 12 formed of $Ca_2Nb_3O_{10}$. Sample No. 5 represents thin film capacitor 1 with polyaniline as the p-type conductive organic polymer in the void portion of dielectric thin film 12 formed of $Ca_2Nb_3O_{10}$. Sample No. 6 represents thin film capacitor 1 with polyethylene dioxythiophene (PEDOT) as the p-type conductive organic polymer, i.e. in the void portion of dielectric thin film 12 formed of $Ca_2Nb_3O_{10}$.

For comparison, the evaluation results of thin film capacitors without a conductive organic polymer in the void portion of dielectric thin film 12 are also shown in Table 1 as sample No. 1 and sample No. 2. Sample No. 1 represents a thin film capacitor in which dielectric thin film 12 is formed of $Ti_{0.87}O_2$. Sample No. 2 represents a thin film capacitor in which dielectric thin film 12 is formed of $Ca_2Nb_3O_{10}$.

Additionally, the evaluation results of the thin film capacitor with an n-type conductive organic polymer filled in the void portion of dielectric thin film 12 for comparison are also shown in Table 1 as samples No. 7 to No. 9. Sample No. 7 represents a thin film capacitor with polypyridine as the n-type conductive organic polymer in the void portion of dielectric thin film 12 formed of $Ti_{0.87}O_2$. Sample No. 8 represents a thin film capacitor with polypyridine as the n-type conductive organic polymer in the void portion of dielectric thin film 12 formed of $Ca_2Nb_3O_{10}$. Sample No. 9 represents a thin film capacitor with poly(p-phenylene vinylene) (PPV) as the n-type conductive organic polymer in the void portion of dielectric thin film 12 formed of $Ca_2Nb_3O_{10}$.

The method of filling an n-type conductive organic polymer in the void portion of the dielectric thin film 12 is conducted as the follows. At step S7 described above, the Pt substrate (nanosheet film 12') is immersed in electrolytic polymerization solution 22, and is galvanized for 180 seconds by an electrical current of 2.5 μA from galvanostat (constant current device) 26, with the Pt substrate being used as the cathode and SUS plate 24 being used as the anode. Accordingly, an electrolytic polymerization reaction is conducted on nanosheet film 12', and thereby, the n-type conductive organic polymer is filled in the void portion of nanosheet film 12'. When polypyridine is used as the n-type conductive organic polymer, the electrolytic polymerization solution 22 is an acetonitrile solution containing 2,5-dichloropyridine (at a concentration of 0.1 mol/L) and n-tetrabutylammonium tetrahydroborate $((C_4H_9)_4NBF_4)$ (at a concentration of 0.2 mol/L). In a case where PPV is used as the n-type conductive organic polymer, the electrolytic polymerization solution 22 is a tetrahydrofuran solution containing α,α,α',α'-tetrabromo-p-xylene (at a concentration of 0.05 mol/L) and n-tetrabutylammonium tetrahydroborate $((C_4H_9)_4NBF_4)$ (at a concentration of 0.1 mol/L).

Table 1 shows that samples No. 3 to No. 6 (thin film capacitor 1 with a p-type conductive organic polymer in the void portion of dielectric thin film 12) exhibited a high and stable insulation property. On the contrary, a short circuit occurs frequently in sample No. 1 and sample No. 2 (thin film capacitor without a conductive organic polymer in the void portion of the dielectric thin film 12), and therefore, they had an insulation problem. Further, samples No. 7 to No. 9 (thin film capacitor with an n-type conductive organic polymer filled in the void portion of dielectric thin film 12) exhibited no improvement in insulation property.

The present invention is not limited to the above embodiment, and may be modified in various ways without departing from the scope of the present invention.

The invention claimed is:

1. A thin film capacitor comprising:
   a substrate;
   a dielectric thin film element disposed on the substrate, the dielectric thin film element comprising:
      a dielectric nanosheet thin film have a void portion filled with a p-type conductive organic polymer; and
      a pair of electrodes configured to sandwich said dielectric nanosheet thin film,
   wherein the dielectric nanosheet thin film comprises $Ti_{0.87}O_2$ or $Ca_2Nb_3O_{10}$, and
   wherein the substrate comprises an Si plate, an $SiO_2$ film on the Si plate, and a Ti film on the $SiO_2$ film.

2. The thin film capacitor according to claim 1, wherein said p-type conductive organic polymer comprises polypyrrole.

3. The thin film capacitor according to claim 1, wherein said p-type conductive organic polymer comprises polyaniline.

4. The thin film capacitor according to claim 1, wherein said p-type conductive organic polymer comprises polyethylene dioxythiophene.

* * * * *